(12) United States Patent
Lu et al.

(10) Patent No.: US 7,851,331 B2
(45) Date of Patent: Dec. 14, 2010

(54) BONDING STRUCTURES AND METHODS OF FORMING BONDING STRUCTURES

(75) Inventors: Szu Wei Lu, Hsinchu (TW); Mirng-Ji Lii, Hsinchu County (TW); Chen-Shien Chen, Hsinchu (TW); Hua-Shu Wu, Hsinchu (TW); Jerry Tzou, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 149 days.

(21) Appl. No.: 11/563,490

(22) Filed: Nov. 27, 2006

(65) Prior Publication Data

US 2008/0122114 A1    May 29, 2008

(51) Int. Cl.
*H01L 21/46* (2006.01)

(52) U.S. Cl. .................. 438/459; 257/618

(58) Field of Classification Search ............. 438/459; 257/618–628
See application file for complete search history.

(56) References Cited

U.S. PATENT DOCUMENTS

| | | | |
|---|---|---|---|
| 6,075,712 A | 6/2000 | McMahon | |
| 6,268,660 B1 | 7/2001 | Dhong et al. | |
| 6,846,725 B2 | 1/2005 | Nagarajan et al. | |
| 7,056,813 B2 * | 6/2006 | Morrow et al. | 438/459 |
| 7,274,099 B2 * | 9/2007 | Hsu | 257/701 |
| 2005/0113004 A1 * | 5/2005 | Brandes | 451/54 |
| 2006/0220222 A1 * | 10/2006 | Zeng | 257/700 |
| 2007/0170583 A1 * | 7/2007 | Kwon et al. | 257/724 |

FOREIGN PATENT DOCUMENTS

| | | |
|---|---|---|
| CN | 2582177 | 10/2003 |
| CN | 101131948 A | 2/2008 |

OTHER PUBLICATIONS

Semiconductor International Nov. 2003 at http://www.tf.uni-kiel.de/matwis/amat/semi_en/running_term/articles_seminar... Jul. 19, 2006, 5 pages.
Tanaka et al., Low-Cost Through-hole Electrode Interconnection for 3D-SiP Using Room-temperature Bonding, 2006 Electronic Components and Technology Conference, pp. 814-818.
Xintec Inc., "Wafer Level Innovative Pack", at http://www.xintec.com.tw/product/main.htm on Feb. 9, 2006, 4 pages.

* cited by examiner

*Primary Examiner*—Bradley K Smith
*Assistant Examiner*—Tony Tran
(74) *Attorney, Agent, or Firm*—Duane Morris LLP

(57) ABSTRACT

A semiconductor structure includes a first substrate and a second substrate bonded over the first substrate. The first substrate includes a passivation layer formed over the first substrate. The passivation layer includes at least one first opening exposing a first bonding pad formed over the first substrate. The second substrate includes at least one second opening aligned with and facing the first opening.

16 Claims, 19 Drawing Sheets

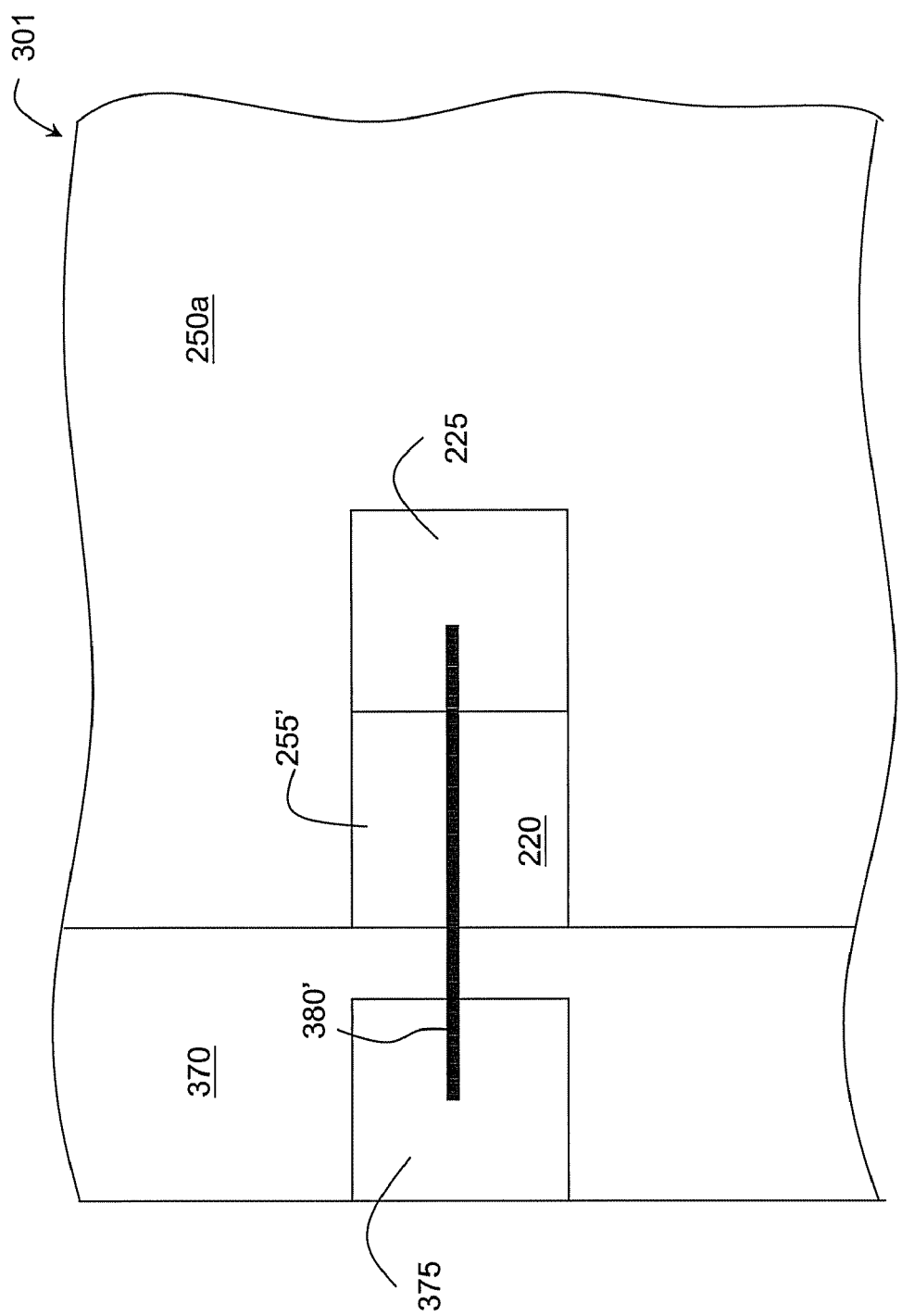

BONDING STRUCTURES AND METHODS OF FORMING BONDING STRUCTURES

BACKGROUND OF THE INVENTION

1. Field of the Invention

The present invention relates to semiconductor structures and methods of forming the semiconductor structures, and more particularly to bonding structures and methods of forming bonding structures.

2. Description of the Related Art

With advances associated with electronic products, semiconductor technology has been widely applied in manufacturing memories, central processing units (CPUs), liquid crystal displays (LCDs), light emission diodes (LEDs), laser diodes and other devices or chipsets. In order to achieve high-integration and high-speed goals, dimensions of semiconductor integrated circuits continue to shrink. Various materials and techniques have been proposed to achieve these integration and speed goals and to overcome manufacturing obstacles associated therewith. In order to shrink die size, a through wafer via (TWV) technique has been used in this field.

FIGS. 1A-1E are cross-sectional views showing a prior art method of forming TWV.

As shown in FIG. 1A, a multi-level interconnect structure 110 comprising metal layers 115 is formed over a substrate 100. Bonding pads 125 are formed over the multi-level interconnect structure 110. A passivation layer 120 is formed over the bonding pads 125 and includes openings 130 formed therein partially exposing the bonding pads 125.

In FIG. 1B, a dummy substrate 150 is bonded on the passivation layer 120 by a thermal tape 155. The dummy substrate 150 serves as a carrier for grinding the substrate 100. After the thermal tape bonding, the substrate 100 is grinded, thereby forming a remaining substrate 100a having a thickness of about 150 μm as shown in FIG. 1C.

Turning to FIG. 1D, TWVs 160 are formed within the substrate 100a, contacting with the metal layers 115. TWVs 160 provide electrical connection between the metal layers 115 to which diodes or circuits are coupled and another substrate (not shown). TWVs 160 usually include a diffusion barrier layer and a metal layer which is formed by a chemical vapor deposition (CVD) or physical vapor deposition (PVD) step having a processing temperature of about 300° C. The diffusion barrier layer can be a conductive layer such as a metal nitride layer or a dielectric layer such as a silicon nitride layer. The thermal tape 155, however, cannot tolerate such a processing temperature, and the thermal tape 155 may dissolve and/or fail to adequately bond the dummy structure 150 to the passivation layer 120. The dummy substrate 150 may separate from the passivation layer 120 in subsequent processing steps, such as a chemical mechanical planarization (CMP) processing step for planarizing the metal layer provided for the formation of the TWVs 160. Consequently, the substrate 100a can be damaged by the CMP step.

From the foregoing, semiconductor structures and methods of forming the semiconductor structures are desired.

SUMMARY OF THE INVENTION

In accordance with some exemplary embodiments, a semiconductor structure includes a first substrate and a second substrate bonded over the first substrate. The first substrate includes a passivation layer formed over the first substrate. The passivation layer includes at least one first opening exposing a first bonding pad formed over the first substrate. The second substrate includes at least one second opening aligned with and facing the first opening.

In accordance with some exemplary embodiments, a method of forming a semiconductor structure is provided. A dummy substrate is bonded over a first substrate. The first substrate comprises a passivation layer formed thereover. The passivation layer comprises at least one first opening exposed a first bonding pad formed over the first substrate. The dummy substrate comprises at least one second opening aligned with and facing the first opening. The first substrate is thinned using the dummy substrate as a carrier for the first substrate. The dummy substrate is thinned to expose the first opening and second opening.

The above and other features will be better understood from the following detailed description of the preferred embodiments of the invention that is provided in connection with the accompanying drawings.

BRIEF DESCRIPTION OF THE DRAWINGS

Following are brief descriptions of exemplary drawings. They are mere exemplary embodiments and the scope of the present invention should not be limited thereto.

FIG. 3F shows an enlarged partial top view of region 301 of FIG. 3B.

DESCRIPTION OF THE PREFERRED EMBODIMENT

Figure 1A:
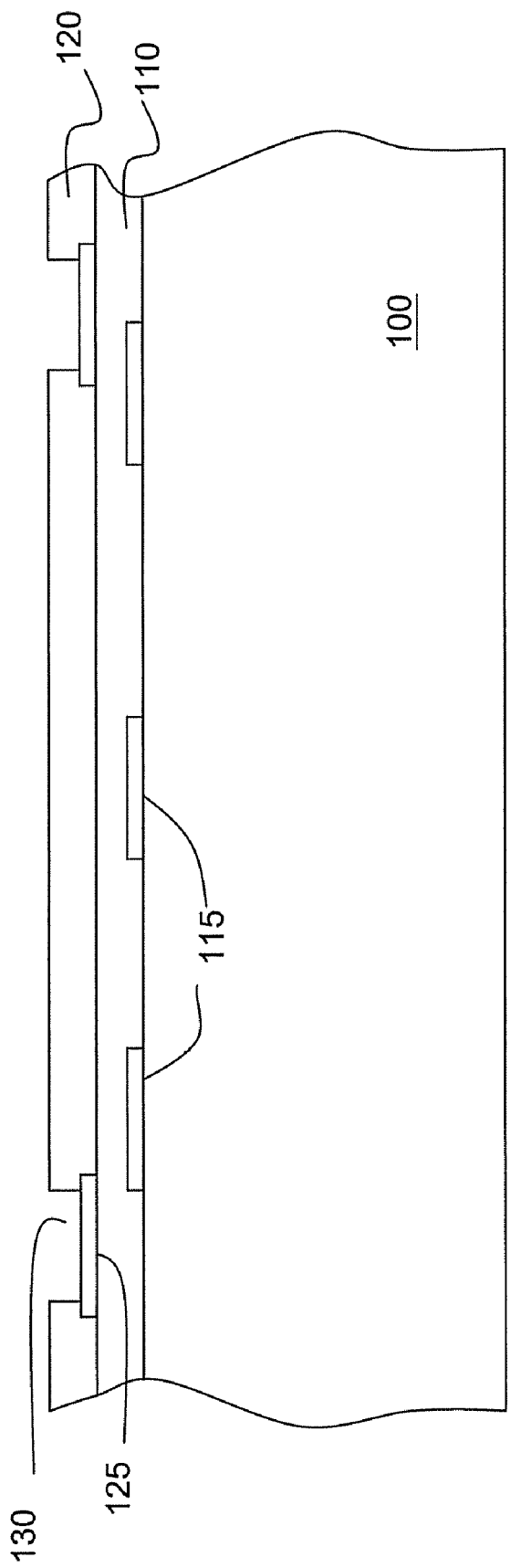
FIGS. 1A-1E are cross-sectional views showing a prior art method of forming TWV.
Figure 1B:
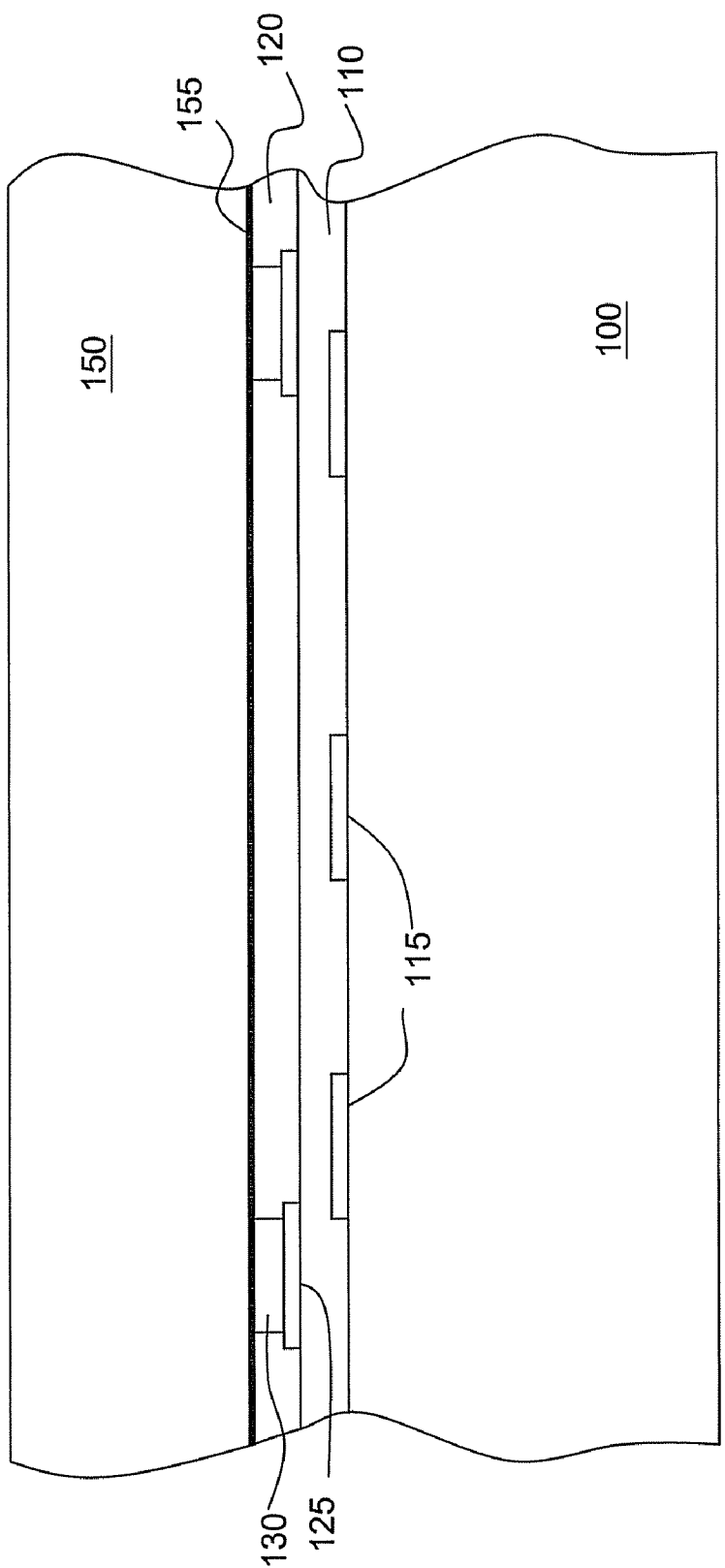
Figure 1C:
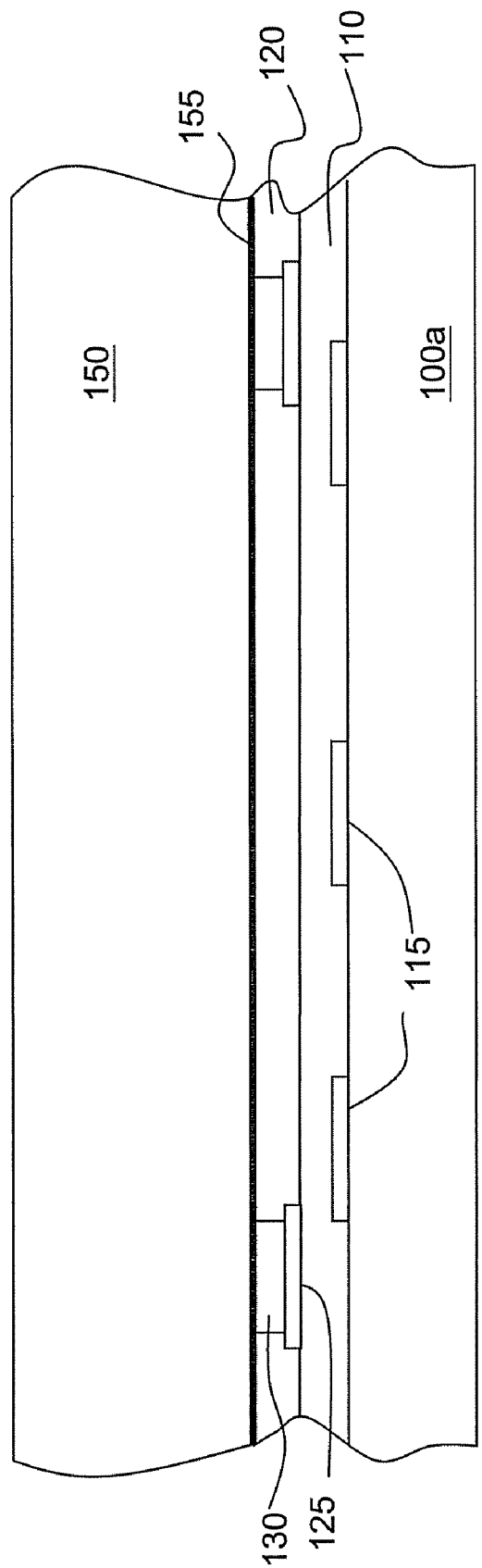
Figure 1D:
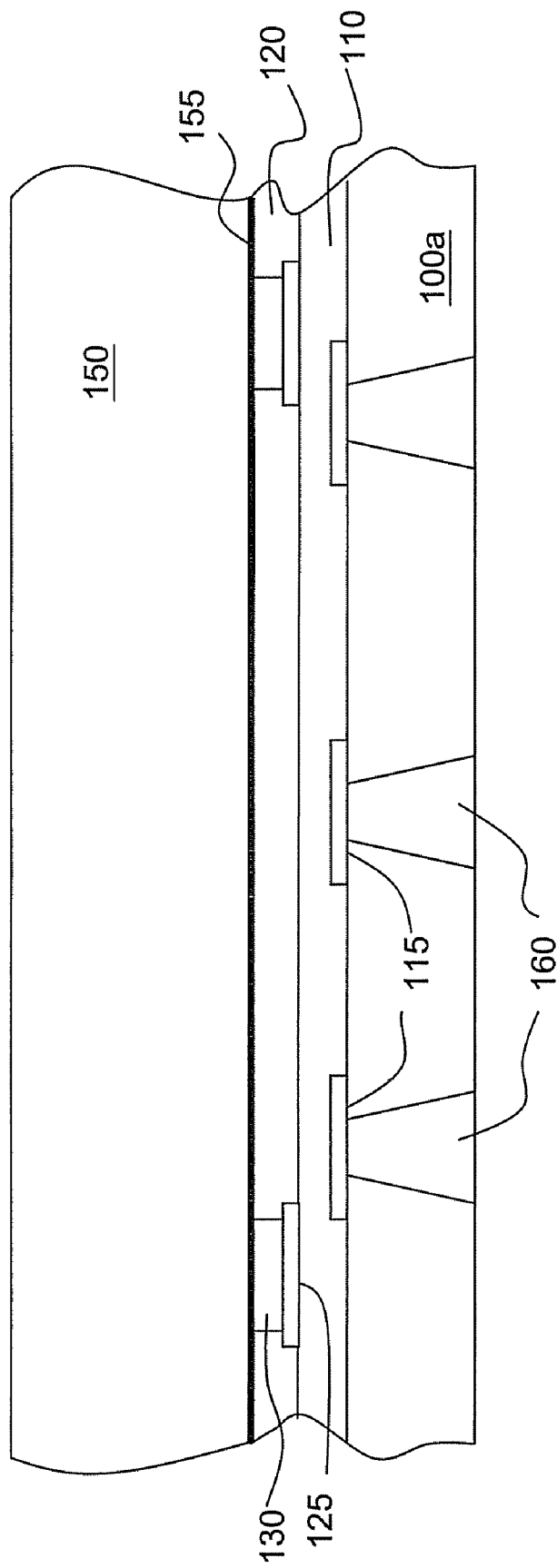
Figure 1E:
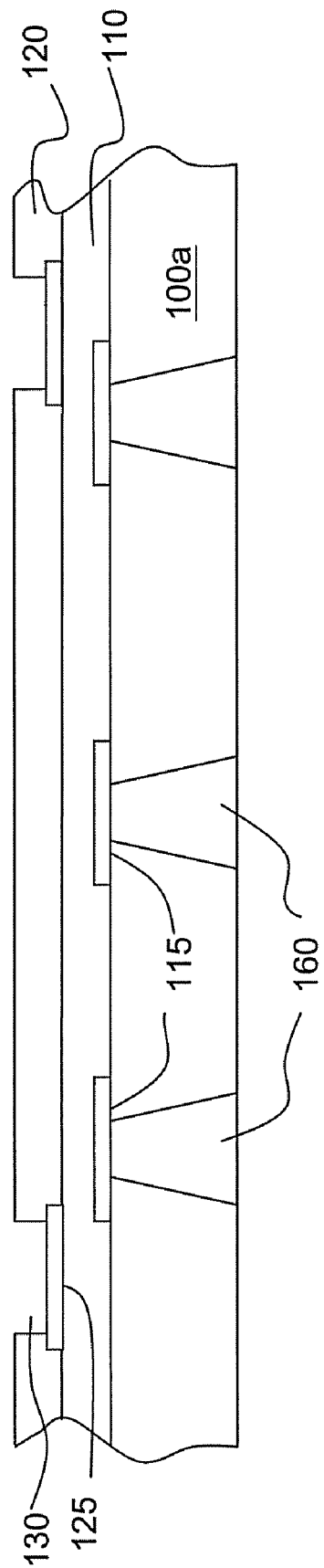

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

FIGS. 2A-2D are schematic cross-sectional views of an exemplary method of bonding a thinned dummy substrate over a substrate.

Figure 2A:
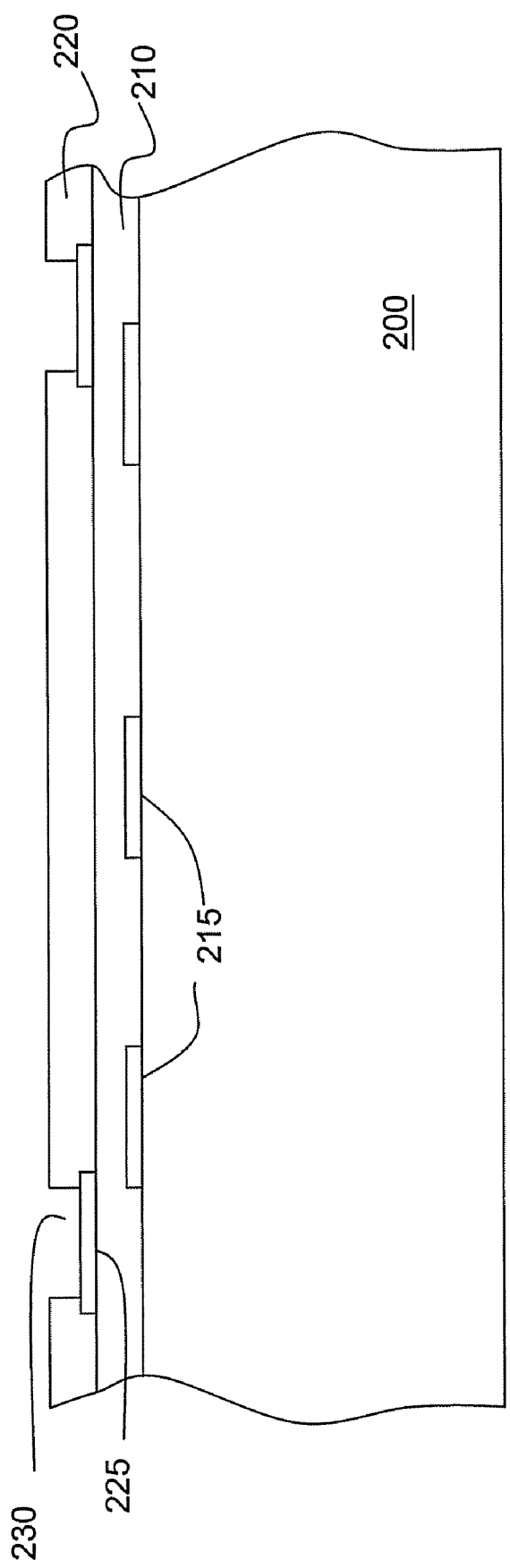
FIGS. 2A-2D are schematic cross-sectional views of an exemplary method of bonding a thinned dummy substrate over a substrate.

Referring to FIG. 2A, a substrate 200 comprises a multi-level structure 210 formed thereover. The substrate 200 can be a silicon substrate, III-V compound substrate, display substrate such as a liquid crystal display (LCD), plasma display, electro luminescence (EL) lamp display, or light emitting diode (LED) substrate (collectively referred to as, substrate 200), for example. The substrate 200 may have an initial thickness between about 600 μm and about 1,200 μm. On the substrate 200, various active devices such as MOSFET and bipolar, passive devices such as resistors, capacitors and inductors, diodes, devices and/or circuits (not shown) are formed. The multi-level structure 210 may comprise at least one conductive layer 215 (e.g., metal layers, vias, contacts, damascene structures, dual damascene structures, combinations thereof, or the like) and at least one dielectric layer (not labeled) (e.g., oxide layer, nitride layer, oxynitride layer, low-k dielectric layer, combinations thereof, or the like), as will be familiar to those in the art. The multi-level structure 210 is formed to provide interconnection among the diodes, transistors, devices and/or other circuit devices formed on the substrate 200. These devices and the multi-level structure 210 can be formed, for example, by photolithographic processing steps, etch processing steps, implantation processing steps, metallization processing steps, deposition processing steps, cleaning processing steps and/or combinations thereof or the like.

At least one bonding pad 225 is formed over the multi-level structure 210, providing electrical connection with another substrate (not shown). The bonding pads 225 may comprise a copper (Cu) layer, aluminum (Al) layer, AlCu layer, combinations thereof or the like. The bonding pad 225 may be formed by a physical vapor deposition (PVD) step, chemical vapor deposition (CVD) step, electrochemical plating step, electroless plating step, combinations thereof or the like.

A passivation layer 220 is formed over the multi-level structure 210. The passivation layer 220 may comprise at least one opening 230 formed over the bonding pad 225. The passivation layer 220 may comprise an oxide layer, nitride layer, oxynitride layer, polyimide layer, PIQ™ (provided by Hitachi Chemical Co., Ltd. of Tokyo, Japan), combinations thereof or the like. The passivation layer 220 may be formed by, for example, a CVD step, spin-coating step, combinations thereof or the like. The openings 230 may be formed by a photolithographic step and an etch step, for example. The openings 230 are provided such that the bonding pads 225 are exposed for wire bonding or flip bonding to another substrate (not shown). In some embodiments, the openings 230 may have a length and width between about 30 µm and about 45 µm or an equivalent diameter.

Figure 2B:
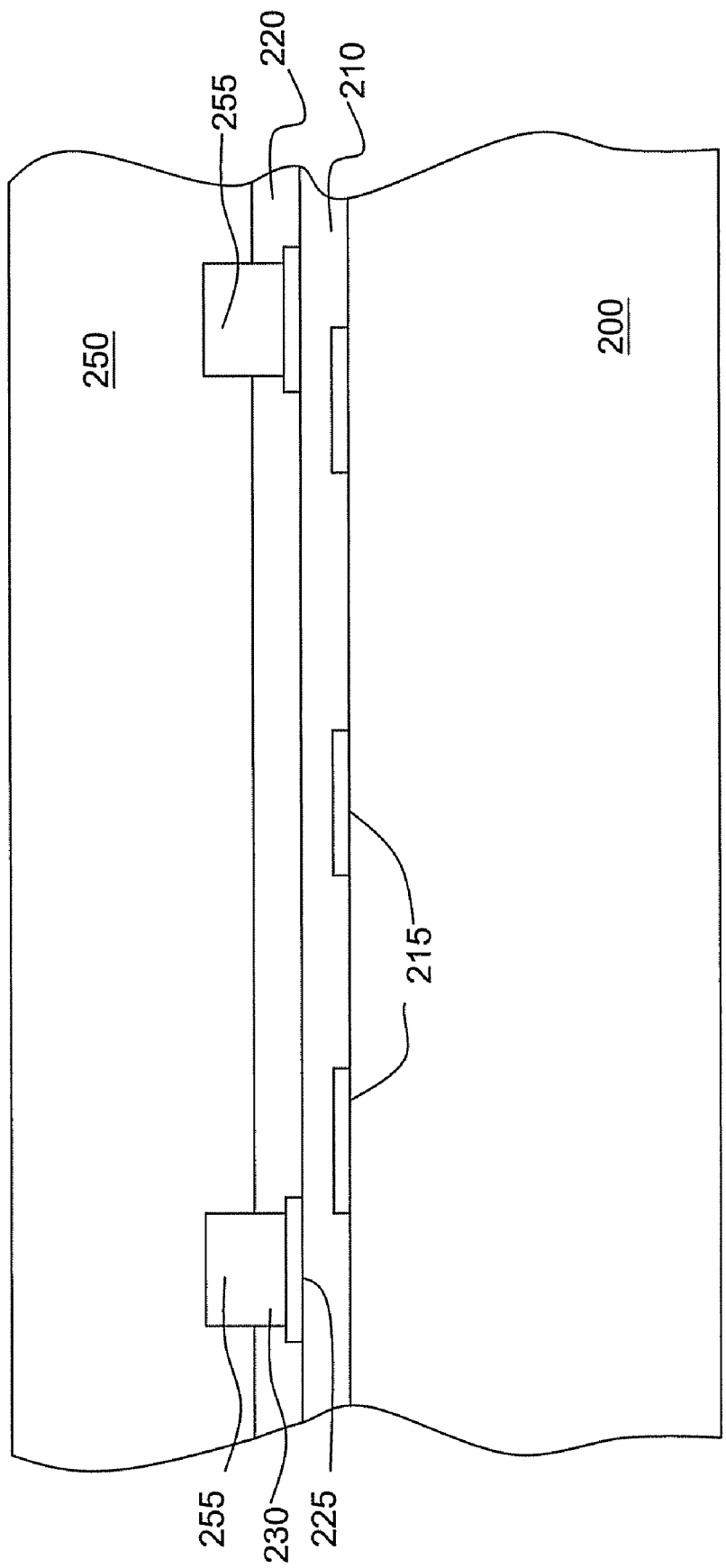

Referring to FIG. 2B, a dummy substrate 250 is bonded over the substrate 200, i.e., the passivation layer 220. The dummy substrate 250 may comprise at least one opening 255 formed therein. The openings 255 can be, for example, trench, square openings, rectangular openings, combinations thereof or the like. The openings 255 correspond to or align with and face the openings 230, wherein the openings 255 are substantially equal to or larger at least in width, length and/or diameter than the openings 230. For example, the openings 255 may have length and/or width substantially equal to those of the openings 230, and the openings 255 may have a depth of about 10 um or more. The depth is determined based on the final thickness (after thinning) of the dummy substrate 250 required. In other embodiments, the openings 255 may have length and/or width larger than those of the openings 230, and have a depth of about 20 µm or more.

The dummy substrate 250 can be a silicon substrate, III-V compound substrate, glass substrate or other substrates (collectively referred to as, dummy substrate 250), for example. In some embodiments, the dummy substrate 250 does not include any integrated devices, diodes and/or circuits formed therein or thereon. The dummy substrate 250 may comprise a silicon layer, oxide layer, nitride layer, oxynitride layer, combinations thereof or other material layer which has a material propensity for bonding with the passivation layer 220. For example, in embodiments, the dummy substrate 250 is a bare silicon wafer and the passivation layer 220 comprises an oxide layer such as silicon oxide. After a thermal treatment and/or plasma treatment, dangling bonds are formed on the surfaces of the silicon wafer and the oxide layer. By a bonding step, dangling bonds on the surfaces of the silicon substrate and the oxide layer may be bonded to each other by Van Der Waal force, for example.

The dummy substrate 250 may be bonded over the passivation layer 200 by, for example, a fusion bonding step, tape bonding step, combinations thereof or the like. For embodiments using the tape-bonding technique, a tape (not shown) is formed between the passivation layer 220 and the dummy substrate 250 such that they are bonded to each other. Due to its material properties, the tape may not tolerate a high-thermal processing step, e.g., a thermal processing step having a processing temperature of about 200° C. or higher. In embodiments using a fusion bonding step, the surfaces of the dummy substrate 250 and/or the passivation layer 220 are subjected to plasma treatments. After the plasma treatments, the dummy substrate 250 can be bonded over the passivation layer 220 at a bonding temperature ranging from about 20° C. to about 500° C. Since the passivation layer 220 and the dummy substrate 250 are bonded without an adhesive layer, e.g., tape, the bonded structure can tolerate a subsequent high-thermal processing step. The bonding step is described in more detail in connection with FIG. 2B.

Figure 2C:
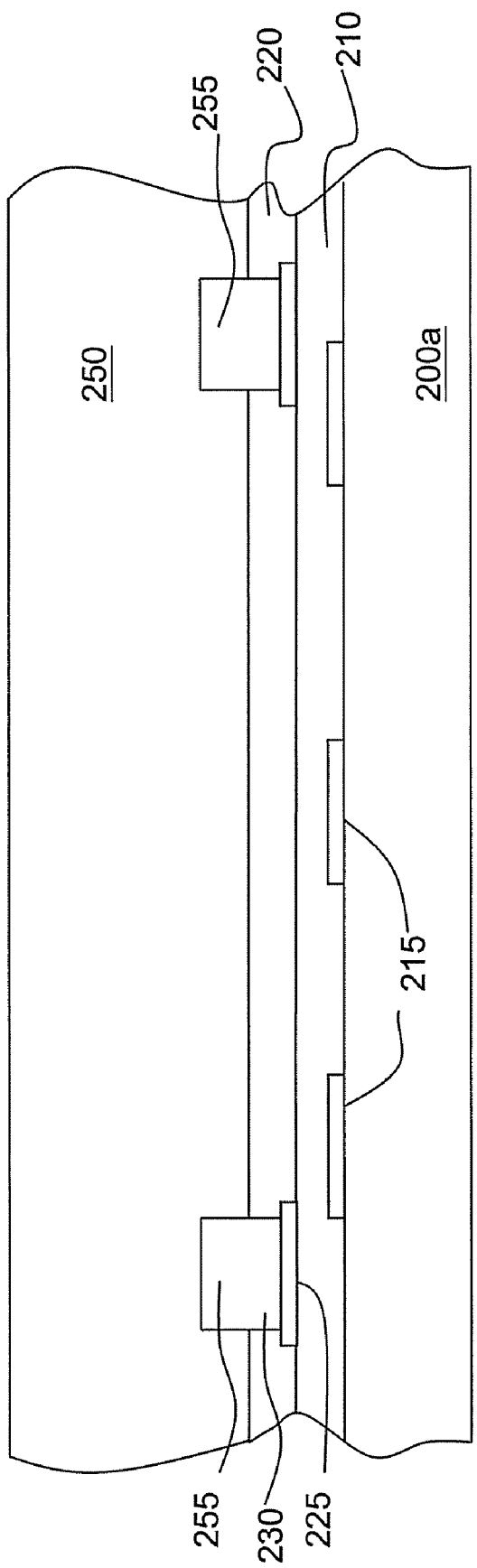
Figure 2D:
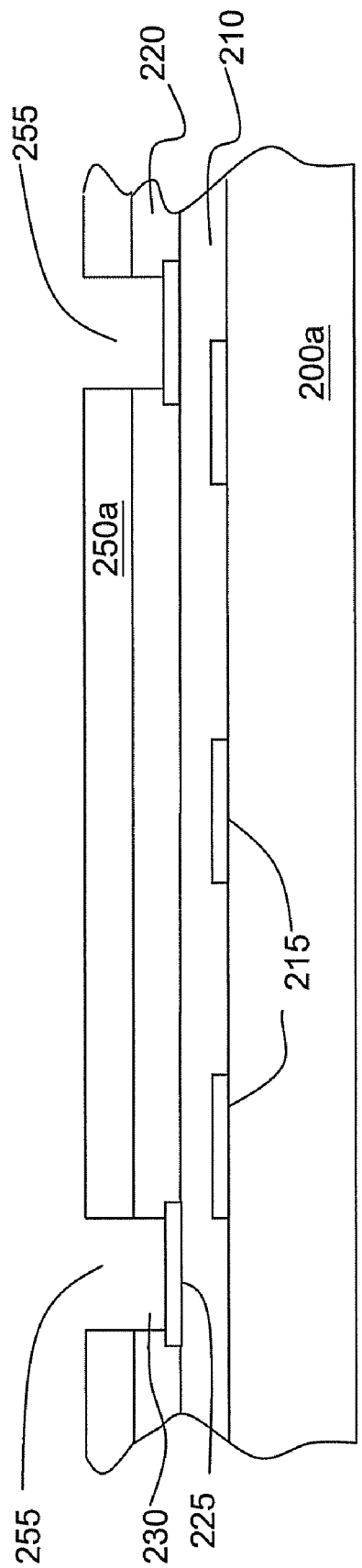

Referring to FIG. 2C, the dummy substrate 250, sometimes referred to herein as a carrier layer, is provided as a carrier for thinning the substrate 200. The thinning step may comprise, for example, a grinding processing step comprising a chemical mechanical planarization (CMP) step. The remaining, thinned substrate 200a may have a thickness between about 50 µm and about 300 µm. After thinning the substrate 200, the remaining substrate 200a can be used as a carrier for use during thinning the dummy substrate 250 as shown in FIG. 2D.

Figure 3A:
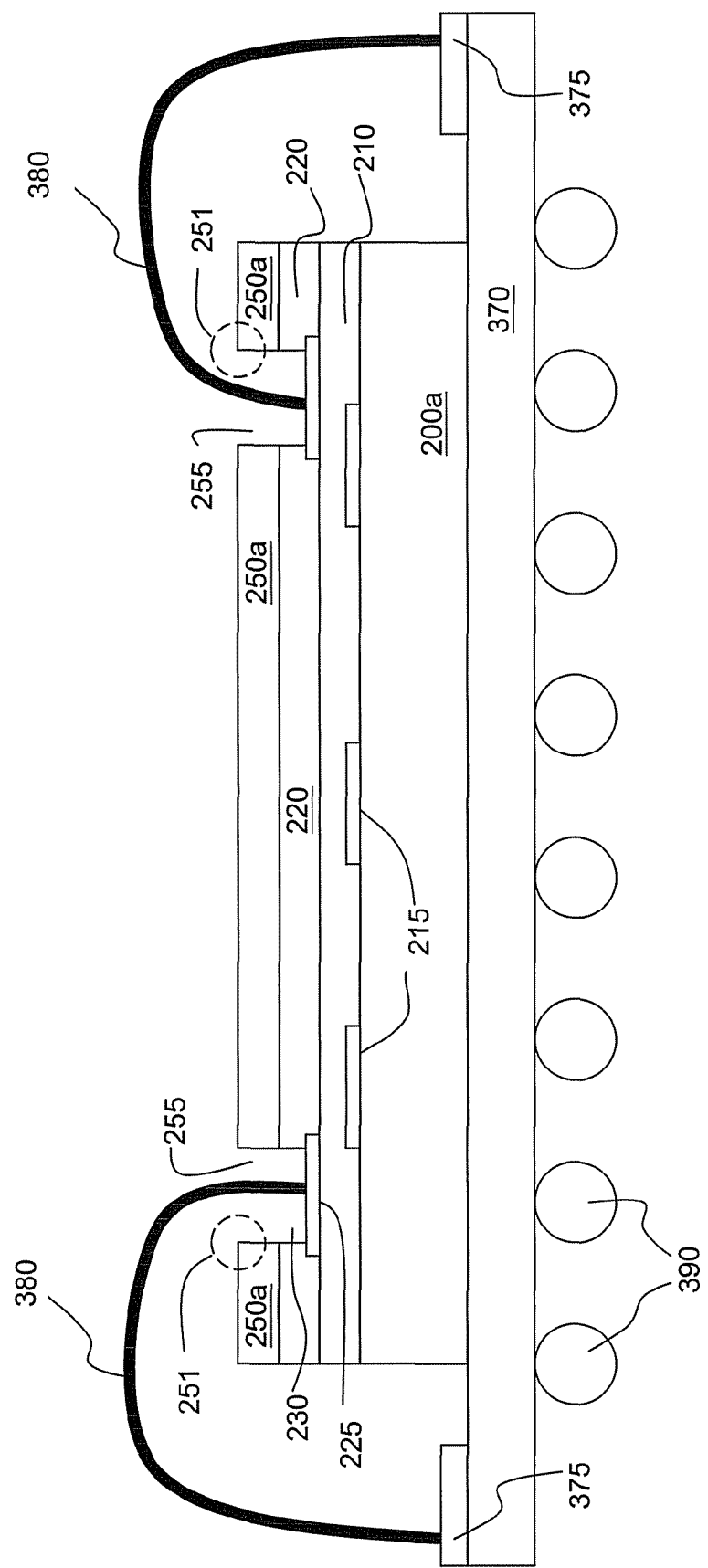
FIGS. 3A-3D are schematic cross-sectional views showing the die of FIG. 2D mounted over a substrate.

The dummy substrate 250 is thinned until the openings 255 and 230 are exposed. In other words, the bonding pads 225 are exposed through the substrate 250a for bonding with another substrate (not shown) such as a chip carrier, for example, an organic substrate, ceramic substrate or leadframe by gold wires. As described above, the openings 255 may be about 10 um or more in depth. The thinned dummy substrate 250a may have a thickness between about 5 µm and about 100 µm. In other embodiments, the openings 255 may have a depth of about 10 µm or more within the dummy substrate 250. However, the dummy substrate 250 may be thinned such that the final depth of the openings 255 within the thinned dummy substrate 250 is about 10 um or more. The thickness of the thinned dummy substrate 250a is controlled so that top corners of the thinned dummy substrate 250a do not interfere with a subsequent wire bonding step as shown in FIG. 3A.

Figure 2E:
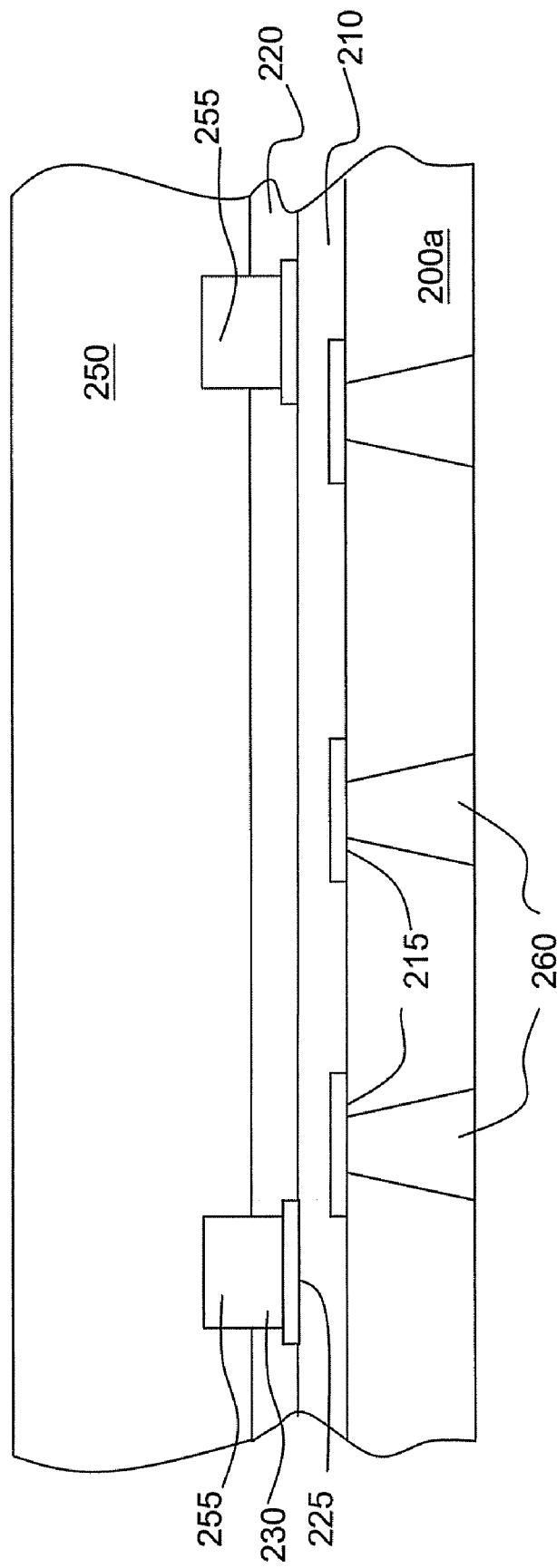
FIGS. 2E-2F are schematic cross-sectional views of an exemplary method of forming at least one through wafer via (TWV) 260 within the thinned substrate 200a shown in FIG. 2C.
Figure 2F:
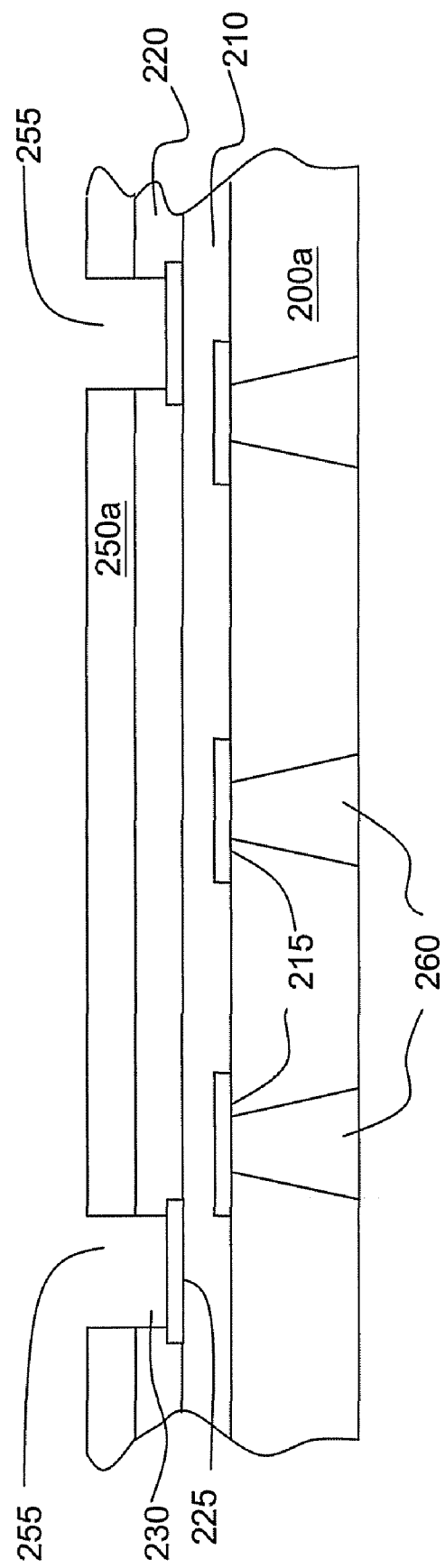

FIGS. 2E-2F are schematic cross-sectional views of an exemplary method of forming at least one through wafer via (TWV) 260 within the thinned substrate 200a shown in FIG. 2C.

Referring to FIG. 2E, TWVs 260 are formed within the remaining substrate 200a, electrically connecting with the conductive layers 215. The process of forming the TWVs 260 may comprise, for example, forming a plurality of openings (not shown) within the thinned substrate 200a to partially expose the conductive layers 215; forming a substantially conformal barrier layer (not shown) within the openings; forming a metal-containing layer (not shown) over the barrier layer; and/or removing portions of the barrier layer and the metal-containing layer, thereby forming the TWVs 260. The openings may be formed by, for example, a photolithographic step and an etch step. The barrier layer may comprise, for example, an oxide layer, nitride layer, oxynitride layer, metal nitride layer, titanium (Ti) layer, titanium nitride (TiN) layer, tantalum (Ta) layer, tantalum nitride (TaN) layer, combinations thereof or the like. The barrier layer can be formed by, for example, a CVD step, PVD step, combinations thereof or the like. The metal-containing layer may comprise, for example, a Cu layer, Al layer, AlCu layer, combinations thereof or the like. The metal-containing layer may be formed by, for example, a CVD step, PVD step, electrochemical plating step, electroless plating step, combinations thereof or the like. The removing step may comprise an etch step, chemical-mechanical planarization (CMP) step, combinations thereof or the like.

For embodiments forming a radio frequency (RF) chip, the conductive layers 215 can be any metal layer (but generally referred to as Metal-1 layers) which are coupled to emitters of RF devices. The TWVs 260 are then mounted over another substrate (not shown), electrically connecting the conductive layers 215 with the substrate for grounding.

For embodiments forming TWVs 260, it is preferred that the bonding step described above in connection with FIG. 2B is a fusion bonding step. Since the fusion bonding step does not use an adhesive layer, such as a tape, the structure shown in FIG. 2E can tolerate the processing temperatures encountered when the barrier layer and/or metal-containing layer are formed at a temperature of about 200° C. or more.

After the formation of the TWVs 260, the dummy substrate 250 is subjected to a thinning process as described above in connection with FIG. 2D. The structure with the thinned dummy substrate 250a is shown in FIG. 2F.

The bonded substrates shown in FIGS. 2D and 2F are subjected to a dicing step along scribe lines (not shown) for forming individual dies. Processes for singulating dies are familiar to those in the art. The dicing step may comprise, for example, a diamond sawing step, laser sawing step, water sawing step, combinations thereof or the like. After the dicing step, the individual die is mounted over another substrate by additional processing steps as described in FIGS. 3A-3E.

Figure 2G:
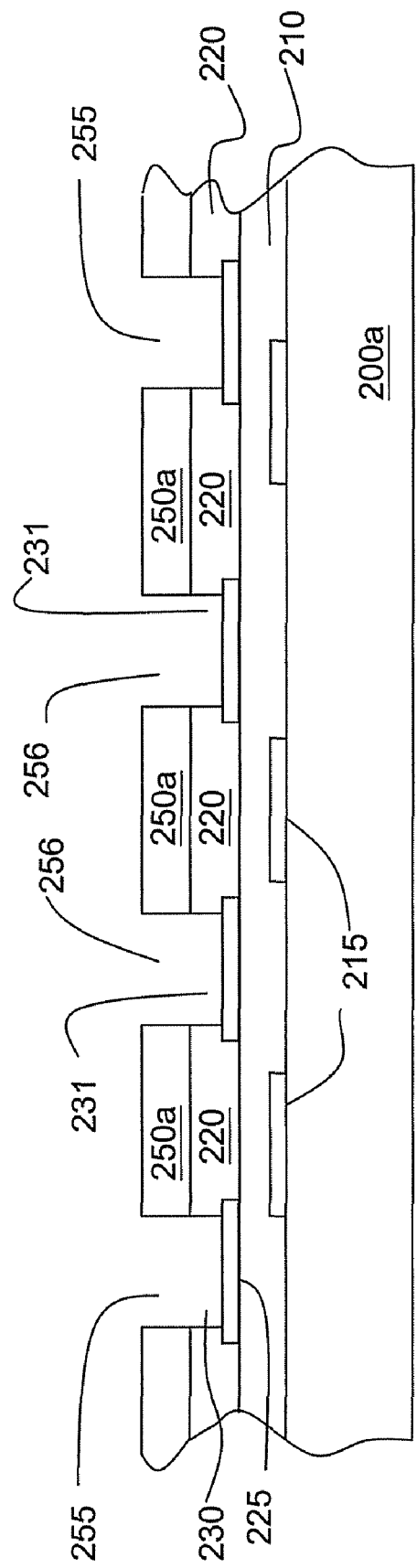
FIGS. 2G-2H are schematic cross-sectional views of an exemplary method of forming a plurality of bump structures.
Figure 2H:
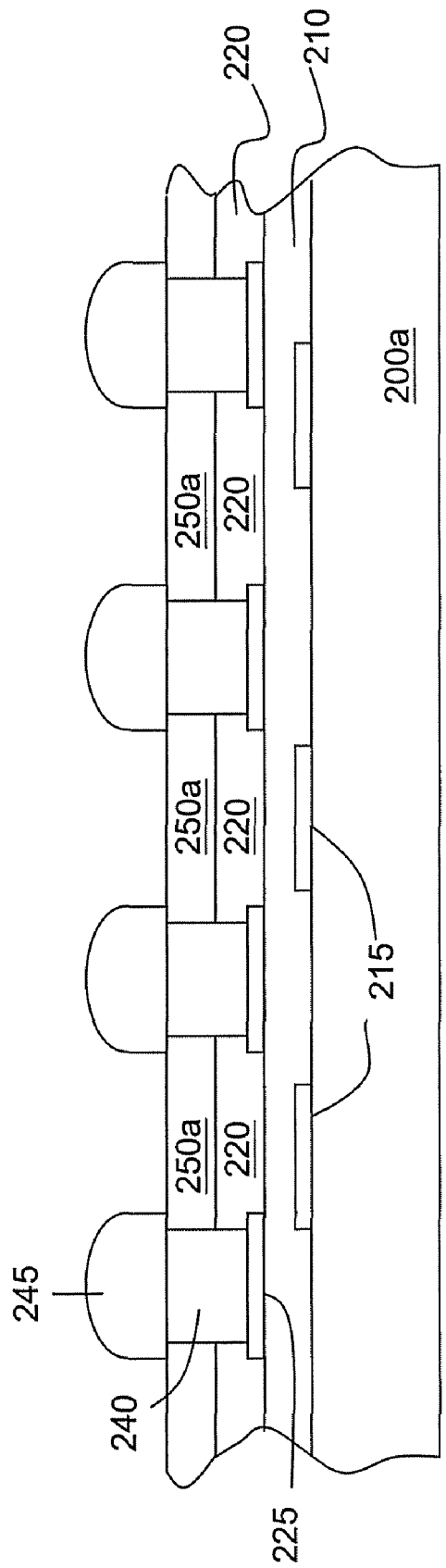

FIGS. 2G-2H are schematic cross-sectional views of an exemplary method of forming a plurality of bump structures.

In order to form a bump structure, a plurality of openings 230, 231, 255 and 256 are formed in the passivation layer 220 and the thinned dummy substrate 250a, respectively. The openings 231 and 256 shown in FIG. 2G can be formed in the same manner as the openings 230 and 255 described above in connection with FIGS. 2A-2D. The openings 231 and 256 are provided such that an array of bumps can be formed over the active region (not shown) of the substrate 200a.

Conductive structures 240 are then formed within the openings 230, 231, 255 and 256 as shown in FIG. 2H. Bumps 245 are formed over the surfaces of the conductive structures 240 and the thinned dummy substrate 250a. The conductive structures 240 may comprise, for example, a Cu layer, Al layer, AlCu layer, solder, combinations thereof or the like, and may be formed by an electrochemical plating step, CVD step, PVD step, electroless plating step, combinations thereof or the like. The bumps 245 may comprise, for example, an Al layer, Cu layer, AlCu layer, gold (Au) layer, solder, combinations thereof or the like, and may be formed by an electrochemical plating step, electroless plating step, combinations thereof or the like. The plating step forms the bumps 245 on the conductive structures 240, but not on the exposed surface of the thinned dummy substrate 250a. In some embodiments, bumps may comprise the conductive structures 240 and the bump 245 according to applied processes.

For these embodiments, the openings 255, 256 may have a depth of about 50 µm or more. By forming the conductive structures 240 within the openings 230, 255 and 231, 256, the conductive structures 240 have a thickness of about 50 µm or more. This thickness of the conductive structures 240 contributes to a desired reliability when the bumps 245 are bonded to another substrate, even if the bumps 245 have a thickness of about 50 µm or less. The combined thickness of the bumps 245 and conductive structures 240 is greater than 50 µm, making the structure less susceptible to stresses associated with the prior art, as described in more detail below. In some embodiments, the conductive structures 240 may extend over or recess below the top surface of the thinned dummy substrate 250a.

A dense array of bump structures can be formed using the structures and methods described in these embodiments. In a traditional bump structure, a spherical bump must have a thickness of about 50 µm or more in order to ensure a desired bonding reliability. Due to its shape, the spherical bump also has a width which is the same as its thickness. If a space between two bonding pads is about 50 µm or less, two spherical bumps formed on the bonding pads may contact to each other. Unlike the traditional bump structure, the openings 255, 256 having a depth of about 50 µm or more, e.g., 100 µm or more, can accommodate the conductive structures 240 with a thickness of about 50 µm or more. With the addition of the conductive structures 240, the bumps 245 formed thereover may have a thickness of about 50 µm or less without bonding reliability concerns because of the additional thickness of the conductive structures 245, i.e., the total thickness of the structures 240 and 245 is greater than 50 µm. In addition, since the bumps 245 can still be about 50 µm or less in width, a dense array of the bumps 245 can be achieved and the space between bonding pads 225 can be reduced. Therefore, the chip size with the bump structure is reduced.

FIGS. 3A-3D are schematic cross-sectional views showing the die of FIG. 2D mounted over a substrate.

As shown in FIG. 3A, the substrate 200a is mounted over a substrate 370 (e.g., a chip carrier as set forth above in connection with FIGS. 2A-2D) under which a plurality of ball grid array (BGA) balls 390 are formed. The substrate 370 may comprise at least one bonding pad 375 formed thereover. The bonding pads 225 are wire bonded to the respective bonding pads 375 for electrical connection between the devices, diodes and/or circuits formed over the substrate 200a and optionally over the substrate 370 by wires 380 through the openings 230 and 255. In some embodiments, the substrate 370 may be a silicon substrate, III-V compound substrate, display substrate such as a liquid crystal display (LCD), plasma display, electro luminescence (EL) lamp display, light emitting diode (LED) substrate, plastic substrate, ceramic substrate, a printed circuit board (PCB) or the like. Accordingly, electrical signals generated from the devices formed over the substrate 200a can be transmitted to the pads 375 through the wires 380, and further to the BGA balls 390 through a conductive pattern (e.g., a routing on the substrate 370) and structure (not shown) formed over or within the substrate 370.

For some embodiments, it is preferred that the thickness of the thinned dummy substrate 250a is controlled so that corners 251 of the thinned dummy substrate 250a do not interfere with the wire bonding. It is noted that the thinned dummy substrate 250a may be provided as a heat spreader through which heat generated from the operations of the diodes, devices and/or circuits formed over the substrate 200a can be dissipated. In some embodiments, the thinned dummy substrate 250a may comprises at least one conductive structure, e.g., TWV, (not shown) formed therethrough for thermal dissipation and/or electrical interconnection if another substrate is mounted over the thinned dummy substrate 250a. In some embodiments, a heat sinker (not shown) may be formed over the thinned dummy substrate 250a to enhance heat dissipation, if the mounting of the heat sinker does not interfere with the wire bonding.

Figure 3B:
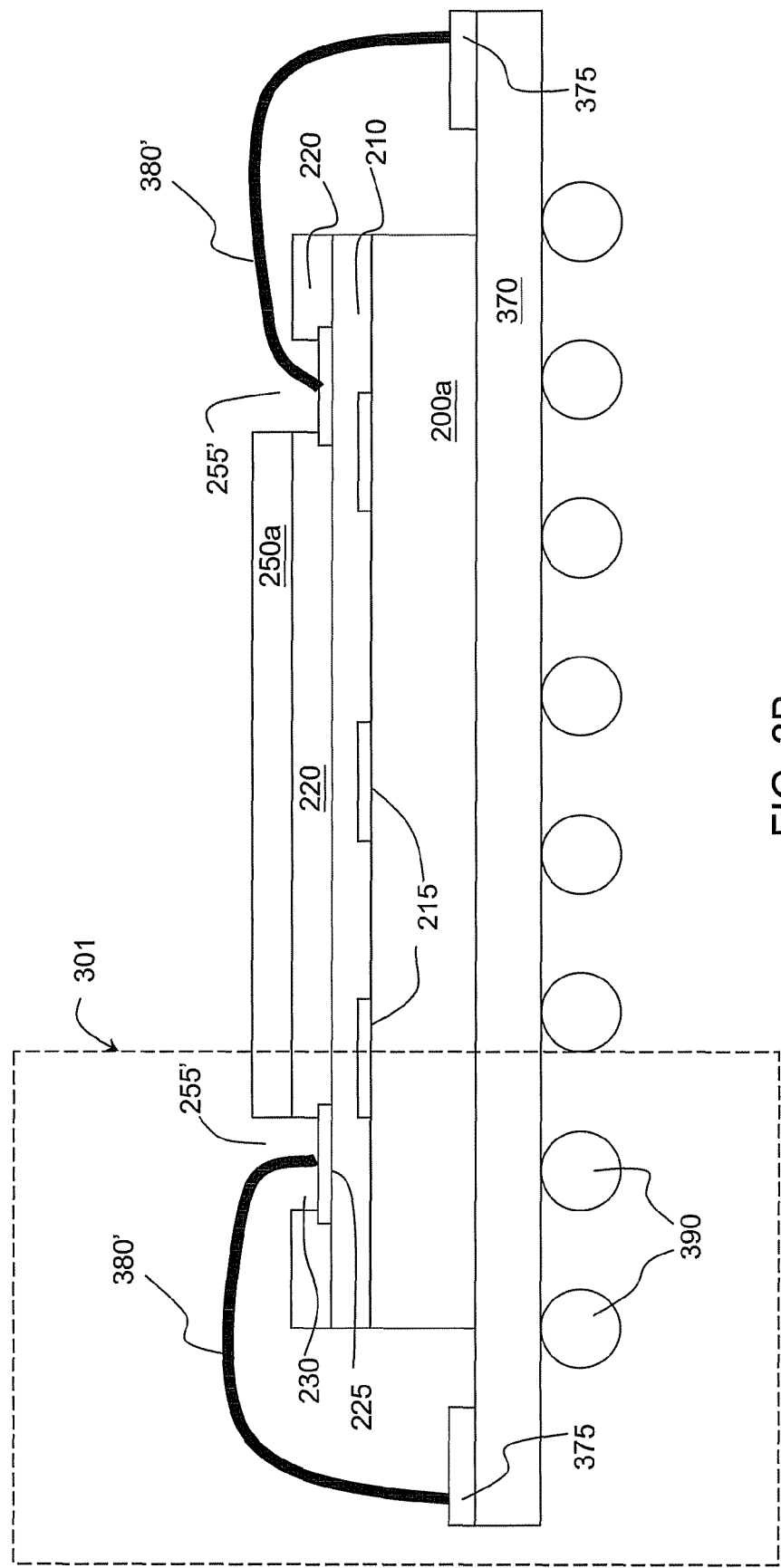

In some embodiments, the openings 255 are larger in cross-sectional area than the openings 230. For example, as shown in FIG. 3B, the openings 255' may extend beyond the opening 230 to the edge of the thinned dummy substrate 250a such that no portion of the thinned dummy substrate 250a remains over the periphery of the die 200a, e.g., scribe line area, in the area where a wire bond is formed. This feature is better shown in FIG. 3F, which is an enlarged partial top view of region 301 of FIG. 3B. Compared with the structure shown in FIG. 3A, the wide openings 255' shown in FIG. 3B effectively avoid any corner interference with the wire bonds 380' from the thinned dummy substrate 250a at the edge of the die 200a. In addition, in this embodiment, the height of the wires 380 may also be reduced.

Figure 3C:
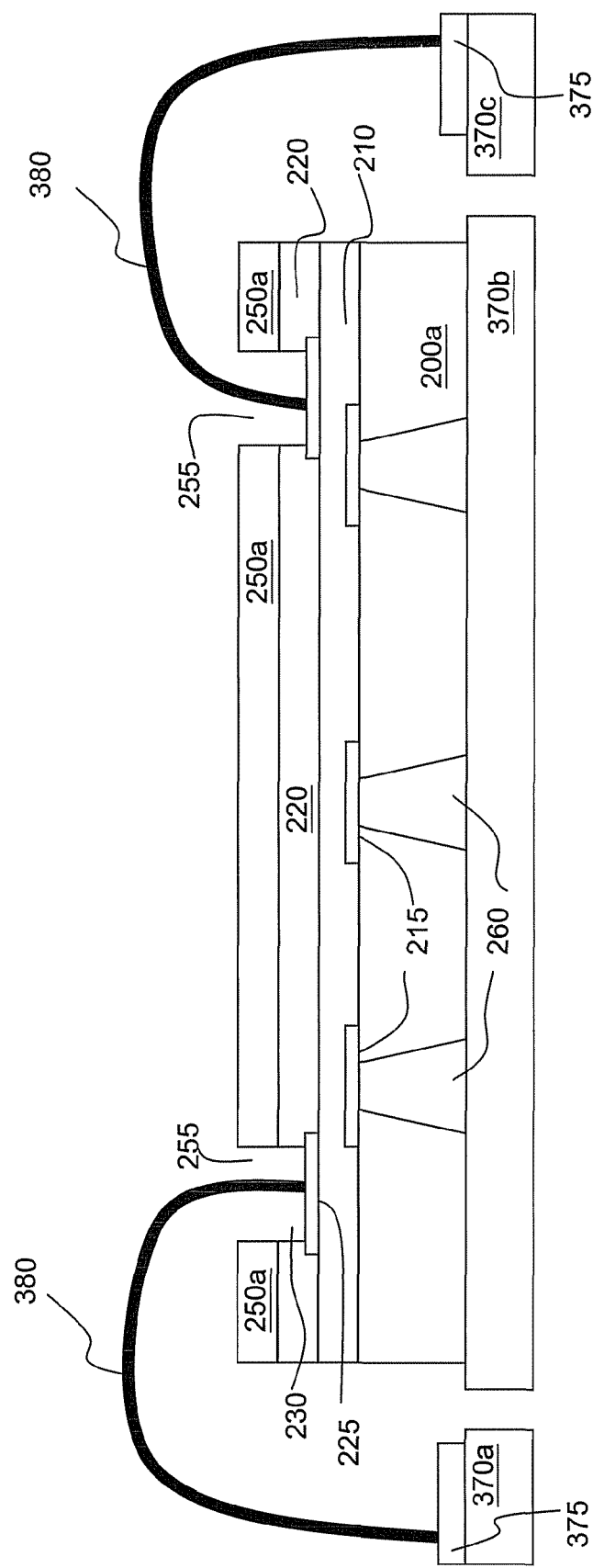

FIG. 3C shows the die from FIG. 2F, which has TWVs 260, mounted over a substrate layer including substrate portions 370a-370c. For embodiments forming a RF device, the substrate sections 370a-370c may comprise a lead frame substrate, for example. The TWVs 260 electrically connect the conductive layers 215 and the substrate section 370b for grounding. The substrate sections 370a and 370c are isolated from the substrate section 370b for providing input/output (I/O) bonding between the bonding pads 325 and 375 by the wires 380. As described above in connection with FIGS. 3A-3B, wide openings 255' and/or a heat sinker (not shown) can be incorporated into the structure shown in FIG. 3C.

Figure 3D:
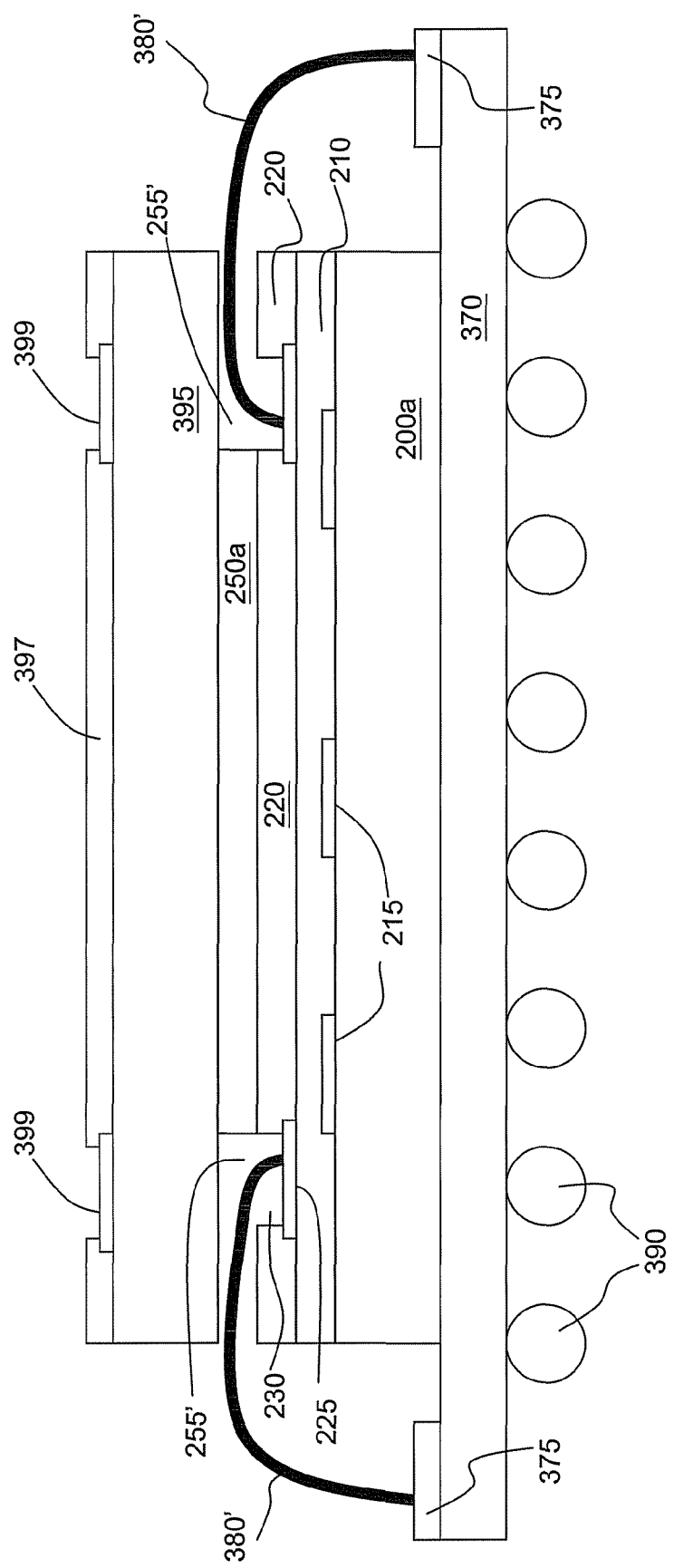

Referring to FIG. 3D, a substrate 395 is mounted over the thinned dummy layer 250a. The substrate 395 may comprise a passivation layer 397 formed thereover. The passivation layer 397 may comprise a plurality of openings (not labeled) exposing bonding pads 399 formed over the substrate 395. The passivation layer 397 and the bonding pads 399 may be the same as, or similar to, the passivation layer 220 and the bonding pads 225, respectively, as described above in connection with FIG. 2A. In some embodiments, the substrate 395 is the same as, or similar to, the substrate 200a described above.

In some embodiments, wide openings 255' have dimensions such that the mounting of the substrate 395 does not interfere with the wire bonding. In addition, the thinned dummy substrate 250a may serve as a spacer for separating the substrates 200a and 395. The thinned dummy substrate 250a may have a thickness of about 50 μm or more such that the mounting of the substrate 395 does not interfere with or contact the wires 380. As set forth above, the thinned dummy substrate 250a may comprise at least one conductive structure (not shown) formed therethrough. The conductive structure may provide an electrical connection between the substrate 200a and the substrate 395.

Figure 3E:
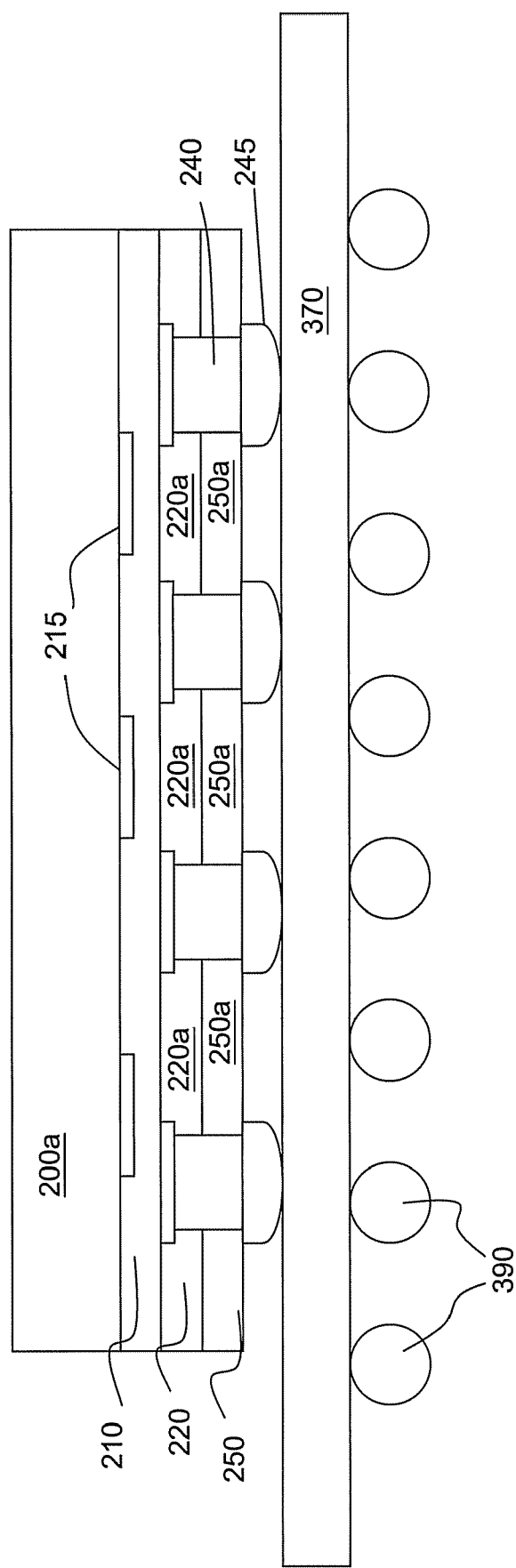
FIG. 3E is a schematic cross-sectional view of a die as shown in FIG. 2H flip mounted over a substrate.

FIG. 3E is a schematic cross-sectional view of a die as shown in FIG. 2H flip mounted over a substrate. As described above in connection with FIG. 2H, a flip chip mounting with a dense bump array can be achieved with improved bonding reliability by bonding the die of FIG. 2H to the substrate 370.

Although the present invention has been described in terms of exemplary embodiments, it is not limited thereto. Rather, the appended claims should be construed broadly to include other variants and embodiments of the invention which may be made by those skilled in the field of this art without departing from the scope and range of equivalents of the invention.

What is claimed is:

1. A method of forming a semiconductor structure, comprising:
   bonding a dummy substrate over a first substrate, the first substrate comprising a passivation layer formed thereover, the passivation layer comprising at least one first opening in which a first bonding pad is formed, the first opening having a first sidewall surrounding the first opening, the dummy substrate comprising at least one second opening therein before bonding the dummy substrate over the first substrate, the second opening having a second sidewall surrounding the second opening and a base, the second sidewall being unconnected to the first sidewall before bonding the dummy substrate, the second opening aligned with and facing the first opening;
   thinning the first substrate using the dummy substrate as a carrier for the first substrate; and
   thinning the dummy substrate to remove the base and expose the first opening through the second opening, without removing the entire dummy substrate.

2. The method of claim 1, wherein the bonding step comprises a fusion bonding step.

3. The method of claim 2 further comprising forming at least one through wafer via (TWV) in the thinned first substrate.

4. The method of claim 3 further comprising:
   mounting the thinned first substrate over a second substrate, the second substrate comprising at least one second bonding pad formed thereover; and
   wire bonding the first bonding pad to the second bonding pad through the first opening and the second opening.

5. The method of claim 4, wherein the second substrate is a lead frame substrate for a radio frequency device.

6. The method of claim 1 further comprising
   mounting the thinned first substrate over a second substrate, the second substrate comprising at least one second bonding pad formed thereover; and
   wire bonding the first bonding pad to the second bonding pad through the first opening and the second opening.

7. The method of claim 1 further comprising dicing the first substrate with the thinned dummy substrate bonded thereover, thereby forming a plurality of individual dies.

8. The method of claim 1, wherein the second opening is substantially equal to or larger than the first opening in area.

9. The method of claim 1, wherein the thinning step includes removing an entire portion of the dummy substrate extending from the base to a back surface of the dummy substrate opposite a surface having the second opening therein, so that the second opening extends through an entire thickness of the dummy substrate after the thinning.

10. The method of claim 1, wherein the first and second openings are substantially equal to each other in width, length and/or diameter.

11. A method of forming a semiconductor structure, comprising:
   providing a first substrate comprising a passivation layer formed thereover, the passivation layer comprising at least one first opening in which a first bonding pad is formed, the first opening having a first sidewall surrounding the first opening;
   providing a dummy substrate separate from the first substrate, the dummy substrate comprising at least one second opening having a base and sidewall surrounding the second opening, the second sidewall being unconnected to the first sidewall;
   fusion bonding the dummy substrate over the first substrate, so that the at least one second opening in the dummy substrate is aligned with and facing the first opening in the first substrate;

thinning the first substrate using the dummy substrate as a carrier for the first substrate; and thinning the dummy substrate to remove the base and expose the first opening through the second opening, without removing the entire dummy substrate.

12. The method of claim 11, further comprising:

mounting the thinned first substrate over a second substrate, the second substrate comprising at least one second bonding pad formed thereover;

wire bonding the first bonding pad to the second bonding pad through the first opening and the second opening.

13. The method of claim 12, wherein the second substrate is a lead frame substrate for a radio frequency device, the second substrate has a first portion over which the thinned first substrate is mounted, and at least one second portion on which the second bonding pad is formed, the second portion being isolated from the first portion.

14. The method of claim 11, further comprising forming at least one through wafer via (TWV) in the thinned first substrate.

15. The method of claim 11, wherein the thinning step includes removing an entire portion of the dummy substrate extending from the base to a back surface of the dummy substrate opposite a surface having the second opening therein, so that the second opening extends through an entire thickness of the dummy substrate after the thinning.

16. The method of claim 11, wherein the first and second openings are substantially equal to each other in width, length and/or diameter.

* * * * *